US012609263B2

(12) United States Patent
Yoo

(10) Patent No.: US 12,609,263 B2
(45) Date of Patent: Apr. 21, 2026

(54) REPELLER FOR ION GENERATING APPARATUS, ION GENERATING APPARATUS AND SEMICONDUCTOR WAFER ION IMPLANTATION APPARATUS

(71) Applicant: Samsung Electronics Co., Ltd., Suwon-si (KR)

(72) Inventor: Kyoungchul Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 370 days.

(21) Appl. No.: 18/498,289

(22) Filed: Oct. 31, 2023

(65) Prior Publication Data

US 2024/0290570 A1     Aug. 29, 2024

(30) Foreign Application Priority Data

Feb. 27, 2023     (KR) ........................ 10-2023-0025835

(51) Int. Cl.
H01J 37/08          (2006.01)
H01J 37/317          (2006.01)
(52) U.S. Cl.
CPC .......... H01J 37/08 (2013.01); H01J 37/3171 (2013.01); H01J 2237/0653 (2013.01)
(58) Field of Classification Search
CPC .. H01J 37/08; H01J 37/3171; H01J 37/32532; H01J 37/32541; H01J 37/32605; H01J 37/32614; H01J 2237/065; H01J 2237/0653; H01J 2237/0656; H01J 2237/08; H01J 2237/0802; H01J 2237/0805; H01J 2237/0807; H01J 2237/31701
See application file for complete search history.

(56) References Cited

U.S. PATENT DOCUMENTS

| | | | |
|---|---|---|---|
| 7,723,699 B2 | 5/2010 | Bassom | |
| 8,022,371 B2 * | 9/2011 | Bassom .................. | H01J 37/08 |
| | | | 250/424 |
| 10,854,416 B1 * | 12/2020 | McLaughlin ......... | H01J 27/205 |
| 11,251,010 B1 * | 2/2022 | Perel ...................... | H01J 37/08 |
| 2015/0357151 A1 | 12/2015 | Colvin et al. | |

FOREIGN PATENT DOCUMENTS

| | | |
|---|---|---|
| KR | 101622892 B1 | 5/2016 |
| KR | 101685405 B1 | 12/2016 |
| KR | 20170019386 A | 2/2017 |
| KR | 101726189 B1 | 4/2017 |
| KR | 101730025 B1 | 4/2017 |

* cited by examiner

*Primary Examiner* — Sean M Luck
(74) *Attorney, Agent, or Firm* — HARNESS, DICKEY & PIERCE, P.L.C.

(57) ABSTRACT

A repeller may be mounted inside an arc chamber of an ion implantation apparatus for doping impurities into a surface film of a semiconductor wafer. The repeller may include a body including an outer circumferential surface and a surface area enlargement portion on the body. The surface area enlargement portion may include striped grooves continuously formed on the outer circumferential surface of the body at intervals in a longitudinal direction of the body.

20 Claims, 5 Drawing Sheets

A

REPELLER FOR ION GENERATING APPARATUS, ION GENERATING APPARATUS AND SEMICONDUCTOR WAFER ION IMPLANTATION APPARATUS

CROSS-REFERENCE TO RELATED APPLICATION(S)

This application claims benefit of priority to Korean Patent Application No. 10-2023-0025835, filed on Feb. 27, 2023 in the Korean Intellectual Property Office, the disclosure of which is incorporated herein by reference in its entirety.

BACKGROUND

Inventive concepts relate to a repeller for an ion generating apparatus, an ion generating apparatus, and/or a semiconductor wafer ion implantation apparatus.

As a manufacturing process for semiconductor wafers, ion implantation is a process widely used to dope semiconductors with impurities in manufacturing silicon wafers. Recently, in the ion implantation process, ions having a certain energy are penetrated into a conductive film or an insulating film of a semiconductor wafer to dope impurities.

An ion generating apparatus is used in the ion implantation process. The ion generating apparatus may heat a filament to emit thermal electrons, and may accelerate the emitted thermal electrons by an electric field to cause the thermal electrodes to collide with an injected ion source gas to generate ions. At this time, the thermal electrons emitted from the tungsten filament may be accelerated to a cathode to secondarily emit electrons from the cathode.

In the ion generating apparatus, a repeller may be installed to face the cathode, and the repeller may serve to reflect electrons emitted from the cathode toward the cathode so that electrons are concentrated to a certain region. A certain voltage may be applied to the repeller to reflect electrons.

A gas, as an ion source, may be injected into the ion generating apparatus, and may collide with an ion source gas inside an arc chamber to be decomposed. The repeller may have a disc shape and may be close to the arc chamber, so heat distribution may not be uniform and there may be a risk of short circuit. If a process of injecting boron gas into the arc chamber to which such a repeller is applied is used for a certain period of time, flakes may occur in the repeller, and a preventive maintenance (PM) period may need to be set to be for shorter intervals.

At this time, a portion of the decomposed gas may be deposited on a surface of the repeller, and the deposited material may be peeled off from the surface of the repeller during a heat cycle or the like and contaminates the inside of the arc chamber. The flakes due to peeling may cause a short circuit between the arc chamber and the repeller.

SUMMARY

An aspect of inventive concepts provides a repeller for an ion implantation apparatus, having a cylindrical shape and being efficient in heat dissipation.

Another aspect of inventive concepts provides an ion generating apparatus capable of preventing a short circuit between a repeller and an arc chamber even when flakes occur by reinforcing insulation between the repeller and the arc chamber.

Another aspect of inventive concepts provides a semiconductor wafer ion implantation apparatus capable of stably doping a semiconductor wafer with impurities for a long time by suppressing the occurrence of flakes of a repeller.

According to an embodiment of inventive concepts, a repeller for mounting inside an arc chamber of an ion implantation apparatus for doping impurities into a surface film of a semiconductor wafer is provided. The repeller may include a body including an outer circumferential surface; and a surface area enlargement portion on the body. The surface area enlargement portion may include striped grooves continuously formed on the outer circumferential surface of the body at intervals in a longitudinal direction of the body.

According to an embodiment of inventive concepts, an ion generating apparatus may include an arc chamber defining a space for generating plasma, the arc chamber including a first side and a second side; a cathode, the cathode in the arc chamber and supported on the first side of the arc chamber; and a repeller, the repeller being in the arc chamber and supported on the second side of the arc chamber, the repeller facing the cathode. The repeller may include a surface area enlargement portion on an outer circumferential surface of the repeller, and the surface area enlargement portion may include striped grooves continuously formed at intervals in a longitudinal direction of the repeller.

According to an embodiment of inventive concepts, a semiconductor wafer ion implantation apparatus may include an ion generating apparatus and an implantation chamber. The ion generating apparatus may include an arc chamber defining a space for generating plasma, a cathode in the arc chamber and supported on a first side of the arc chamber, and a repeller in the arc chamber and supported on a second side of the arc chamber, the repeller facing the cathode. The implantation chamber may be used for injecting an ion beam emitted through the arc chamber into a semiconductor wafer. The repeller may include a surface area enlargement portion on an outer circumferential surface of the repeller, and the surface area enlargement portion may include striped grooves continuously formed at intervals in a longitudinal direction of the repeller.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION

Figure 1:
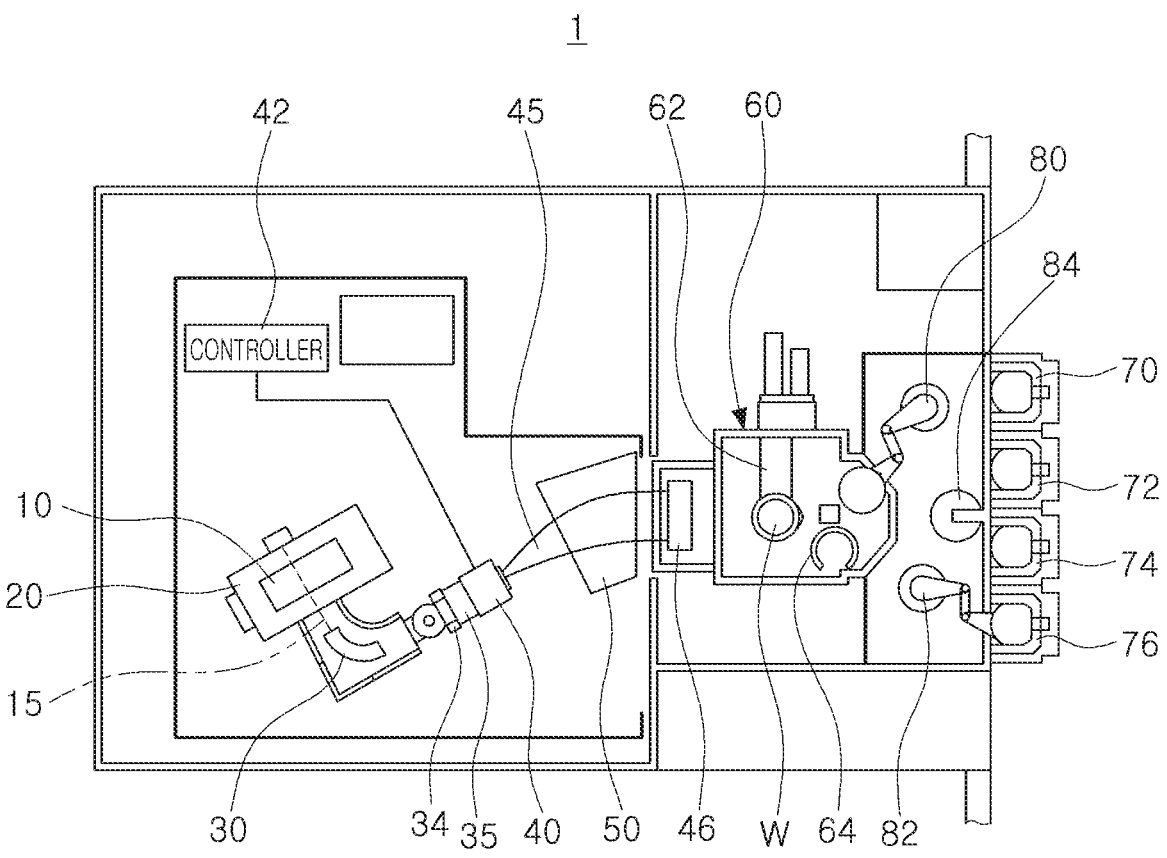
FIG. 1 is a schematic diagram of a semiconductor wafer ion implantation apparatus according to an example embodiment of inventive concepts.

Hereinafter, embodiments in inventive concepts will be described in detail with reference to the accompanying drawings.

The embodiments of inventive concepts may be modified into other forms and are provided so that this disclosure will be thorough and complete and will fully convey the scope of the invention to those of ordinary skill in the art. In the drawings, the shapes and dimensions of elements may be exaggerated for clarity, and like reference numerals denote like elements.

In the present disclosure, the meaning of a "connection" of a component to another component includes an indirect connection through another element as well as a direct connection between two components. In addition, in some cases, the meaning of "connection" includes all "electrical connections".

It may be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The terms used in describe example embodiments of inventive concepts are used to simply describe examples and are not intended to limit inventive concepts. A singular term includes a plural form unless otherwise indicated.

Semiconductor Wafer Ion Implantation Apparatus

FIG. 1 is a schematic diagram of a semiconductor wafer ion implantation apparatus according to an example embodiment of inventive concepts.

Referring to FIG. 1, a semiconductor wafer ion implantation apparatus 1 includes an ion generating apparatus 10 and an implantation chamber 60. The semiconductor wafer ion implantation apparatus 1 is used to dope a semiconductor wafer W with dopant impurities. Dopant impurities are generally ions derived from a source dopant gas. An ion source is used to ionize a dopant gas source into various dopant ion species.

A dopant gas flows into the ion generating apparatus 10 and ions create a plasma environment in the ion generating apparatus 10. Ions subsequently generated in the ion generating apparatus 10 are extracted as an ion beam 15 from the ion generating apparatus 10 by an ion beam extractor 20 including a plurality of metals for generating an ion accelerating magnetic field or an electric field.

The generated ion beam 15 is bent through a mass spectrometer 30 located in a path of the ion beam 15 and oriented through a beam shutter 34. A quadrupole lens system 35 installed subsequent to the beam shutter 34 focuses the ion beam 15, and the focused ion beam 15 passes through a deflection magnet 40 controlled by a controller 42.

The controller 42 provides an alternating current (AC) signal to conductive windings of the deflection magnet 40 to cause the ion beam 15 to be repeatedly deflected or scanned from side to side at a frequency of hundreds of hertz. Such deflection or horizontal irradiation creates a ribbon-shaped ion beam 45 having a thin fan shape.

Existing the deflection magnet 40, ions in the ribbon-shaped ion beam 45 are emitted to enter a parallelizing magnet 50. Here, after passing through the parallelizing magnet 50, the ions constituting the ribbon-shaped ion beam 45 are bent to move along a parallel beam path. The parallel ions then enter an energy filter 46 to remove neutral particles in the ion beam 45.

The ion beam 45 passing through the energy filter 46 has a very narrow rectangular cross-section, and the cross-section has a size capable of implanting ions over the entire surface of a semiconductor wafer W.

The semiconductor wafer W is transported and located in the implantation chamber 60 for implanting ions into the semiconductor wafer W. A support 62 supporting the semiconductor wafer W supports the semiconductor wafer W so that ions are uniformly implanted on the entire surface of the semiconductor wafer W.

The inside of the implantation chamber 60 should maintain a vacuum state during ion implantation. In addition, a robot arm 64 mounted in the implantation chamber 60 moves the semiconductor wafers W into the implantation chamber 60.

Undoped semiconductor wafers 84 from cassettes 70, 72, 74, and 76 are introduced into the implantation chamber 60 via robots 80 and 82. At this time, the robot arm 64 grabs the semiconductor wafer W, brings the semiconductor wafer W into the implantation chamber 60, and places the semiconductor wafer W on an electrostatic clamp or chuck of the support 62. Then, the ion beam is implanted into the semiconductor wafer W.

Ion Generating Apparatus

Figure 2:
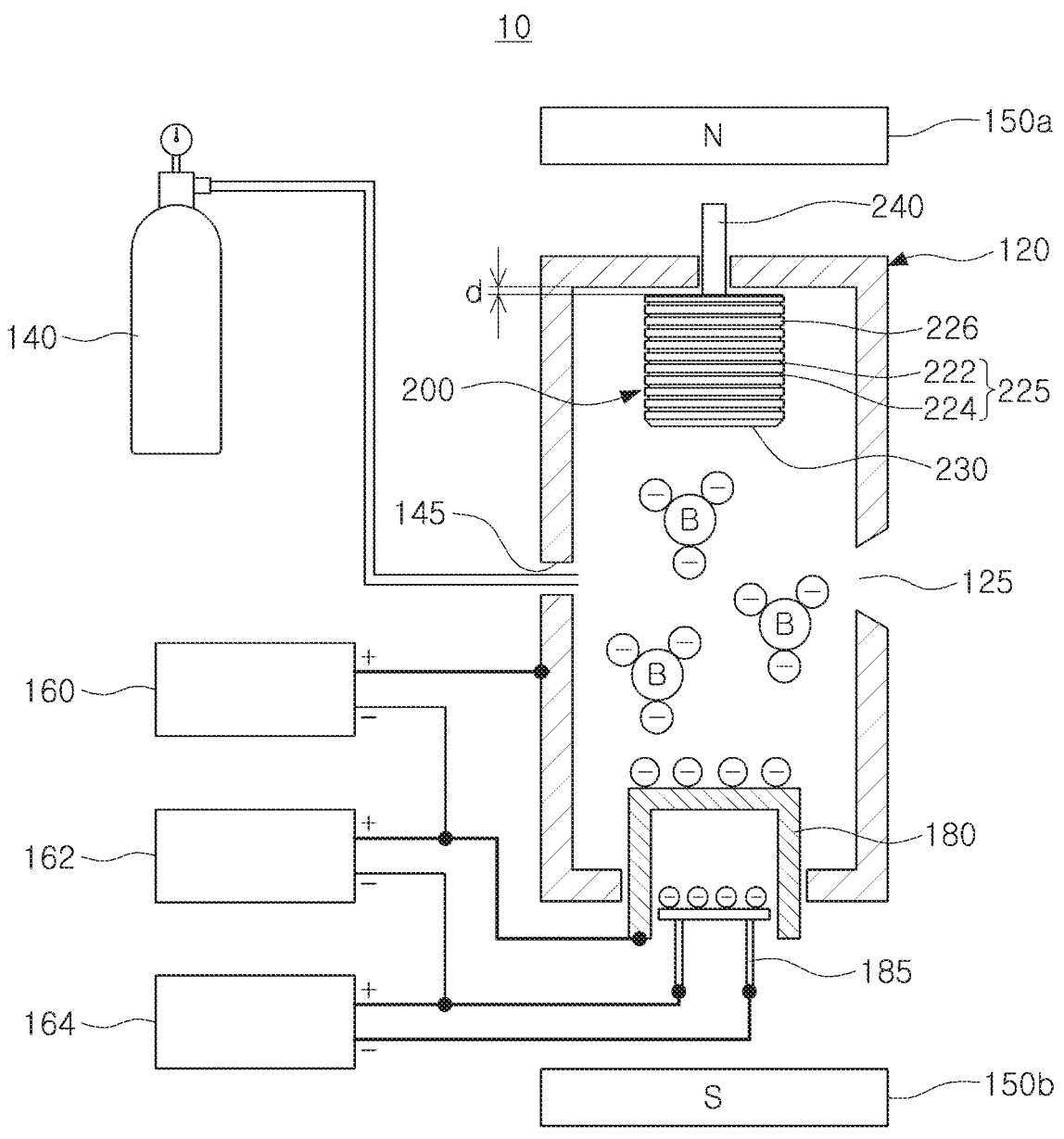
FIG. 2 is a schematic diagram of an ion generating apparatus of FIG. 1.
Figure 3:
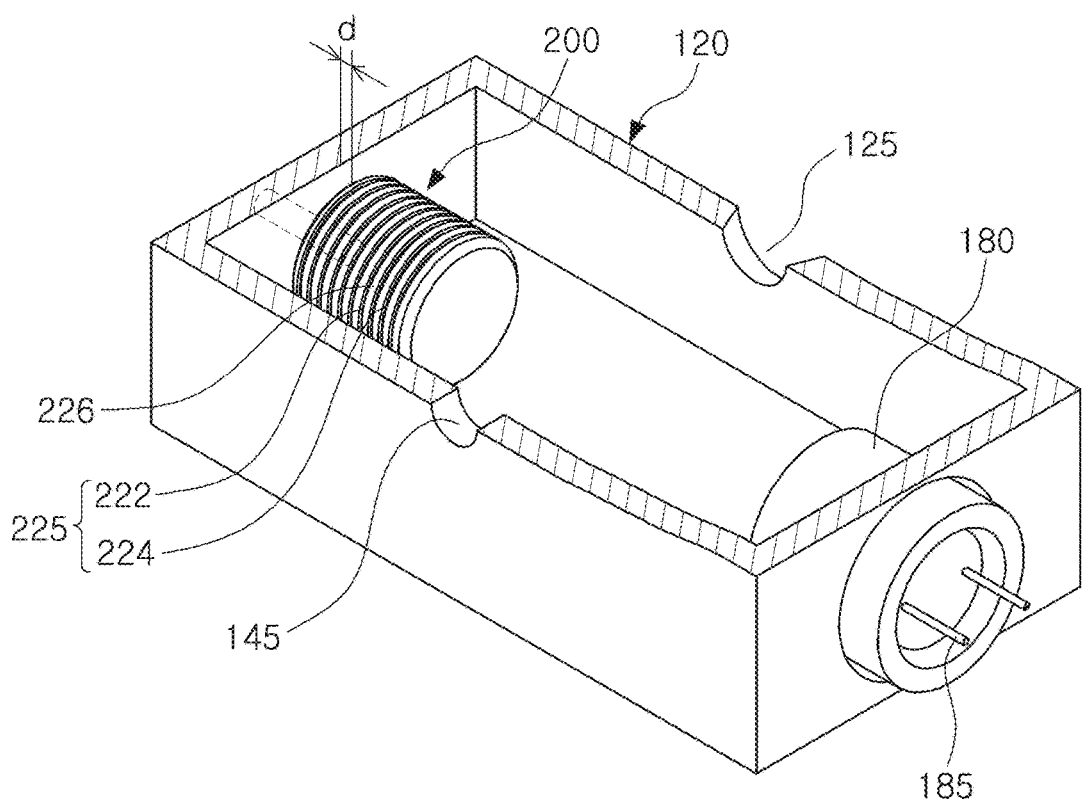
FIG. 3 is a perspective view schematically illustrating the inside of an arc chamber of the ion generating apparatus of FIG. 2.
Figure 4:
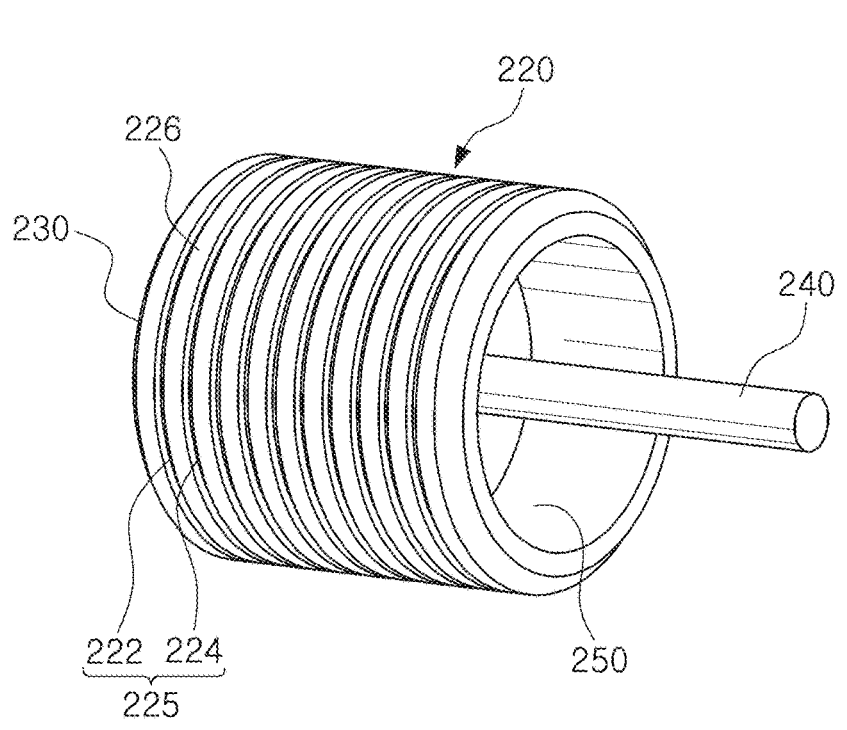
FIG. 4 is a schematic perspective view of a repeller according to an example embodiment of inventive concepts.

FIG. 2 is a schematic view of the ion generating apparatus of FIG. 1, and FIG. 3 is a perspective view schematically illustrating an arc chamber of the ion generating apparatus of FIG. 2. FIG. 4 is a schematic perspective view of a repeller according to an example embodiment of inventive concepts.

Referring to FIGS. 2 to 4, the ion generating apparatus 10 includes an arc chamber 120, a cathode 180, and a repeller 200.

The arc chamber 120 provides a space for generating plasma. The cathode 180 is supported on one side of the arc chamber 120, and a filament 185 is included in an internal space of the cathode 180. The filament 185 may be formed of a metal having a high melting point, such as tungsten, and when a current flows from a filament power supply 164 (e.g., power circuitry) to the filament 185, the filament 185 may be heated to a certain temperature and emits thermal electrons externally. The filament power supply 164 may be outside the arc chamber 120. The cathode 180 is connected to a cathode power supply 162 (e.g., power circuitry), and as the thermal electrons emitted from the filament 185 collide with the cathode 180 by an electric field formed between the filament 185 and the cathode 180, electrons are emitted again from a surface of the cathode 180. The arc chamber 120 forms a desired and/or alternatively predetermined space in a direction in which electrons are emitted from the cathode 180. A gas inlet 145 is formed in one direction of the arc chamber 120, and dopant gas provided from a gas supply 140 flows into the gas inlet 145. An ion outlet 125 is formed in the other direction of the arc chamber 120, and gas and ions are emitted through the ion outlet 125. The dopant gas supplied from the gas supply 140 may be, for example, boron trifluoride ($BF_3$) for implanting boron (B), but is not limited thereto. An arc chamber power supply 160 (e.g., power circuitry) is connected to the arc chamber 120 to accelerate electrons emitted from the cathode 180.

A repeller 200 is formed on the other side of the arc chamber 120, facing the cathode 180. The repeller 200 pushes the electrons emitted from the cathode 180 and accelerated so that the ions are distributed in a limited space. Magnets 150a and 150b are installed near the arc chamber 120 to form a magnetic field in the arc chamber 120. Electrons that are accelerated and moved according to a magnetic field formed inside the arc chamber 120 are rotated by the magnetic field. A rotational motion of the electrons may increase the probability of gas particle collision and increase ionization efficiency.

The repeller 200 has a cylindrical shape, and a surface area enlargement portion 225 is formed around an outer surface of the repeller 200. In the surface area enlargement portion 225, striped grooves 222 and 224 are continuously formed in a longitudinal direction of a body of the repeller 200 at intervals.

The repeller 200 is supported in the arc chamber 120 by an insulating rod 240. In the repeller 200, an inner recess 250 is formed in the longitudinal direction of the body, and the insulating rod 240 is inserted into the inner recess 250 and extends downwardly in the longitudinal direction of the body.

The insulating rod 240 is inserted and fixed to the repeller 200 so that the repeller 200 may be installed at a desired and/or alternatively predetermined interval d (e.g., gap) in the arc chamber 120. The desired and/or alternatively predetermined distance d limits and/or prevents a short circuit between the repeller 200 and the arc chamber 120.

In addition, if a $BF_3$ process for generating B+ ions with boron trifluoride ($BF_3$) is used for a certain period of time or longer, flakes may occur in the repeller 200 (e.g., on the repeller 200). If flakes occur, insulation between the arc chamber 120 and the repeller 200 may not be maintained and may cause ion beam shakes; consequently, a prevention maintenance (PM) cycle should be executed to flakes occurring. However, the PM cycle of the repeller 200 as in the embodiment of inventive concepts may be extended.

Repeller

Figure 5:
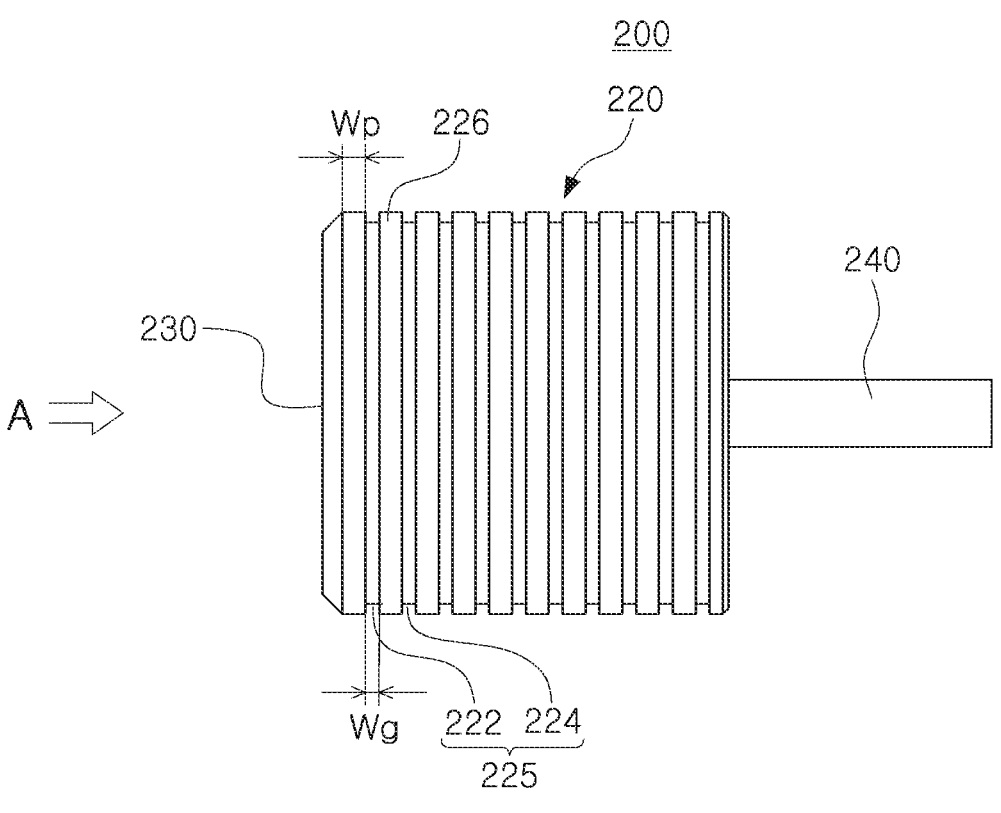
FIG. 5 is a side view of a repeller according to an example embodiment of inventive concepts.
Figure 6:
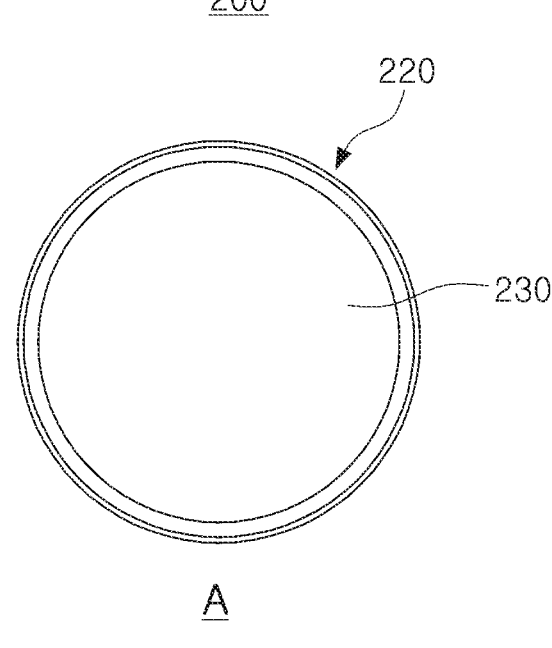
FIG. 6 is a front view of the repeller of FIG. 5, viewed in direction A.

FIG. 5 is a side view of a repeller according to an example embodiment of inventive concepts, and FIG. 6 is a front view of the repeller of FIG. 5 as viewed in direction A.

Referring to FIGS. 5 and 6, the repeller 200 mounted inside the arc chamber 120 of the ion implantation apparatus 1 for doping impurities into a surface film of the semiconductor wafer W is illustrated.

The repeller 200 includes a body 220 forming an outer shape and the surface area enlargement portion 225 formed around the outer surface of the body.

The body 220 has a cylindrical shape with a desired and/or alternatively predetermined length in the longitudinal direction, and striped grooves 222 and 224 are continuously formed around the outer surface of the body 220 at intervals.

In addition, the inner recess 250 is formed on a lower side of the body 220 of the repeller 200 in the longitudinal direction. As shown in FIG. 4, the inner recess 250 may be defined by a recess from a lower end of the repeller 250 and an inner surface of the body 220 surrounding the inner recess 250. The repeller 200 further includes the insulating rod 240 inserted into the inner recess 250 and extending downwardly in the longitudinal direction of the body 220.

The striped grooves 222 and 224 are annular grooves, and ten or less grooves may be formed. The number of striped grooves 222 and 224 may be arbitrarily selected according to a size of the repeller 200. The striped grooves 222 and 224 may make a surface temperature of the repeller 200 more uniform in the arc chamber 120 under a high vacuum condition at a temperature of 2000° C. or higher and a pressure of about 1.0 e-05 Torr.

A gap between the striped grooves 222 and 224 is formed as a protrusion 226, and a width Wp of the protrusion 226 is greater than a width Wg of the striped groove. For example, the ratio Wp/Wg of the width Wp of the protrusion 226 and the width Wg of the striped groove may be less than 9/7.

Meanwhile, a front end 230 of the repeller 200 in the longitudinal direction is exposed as a flat surface to increase a function of reflection.

Figure 7:
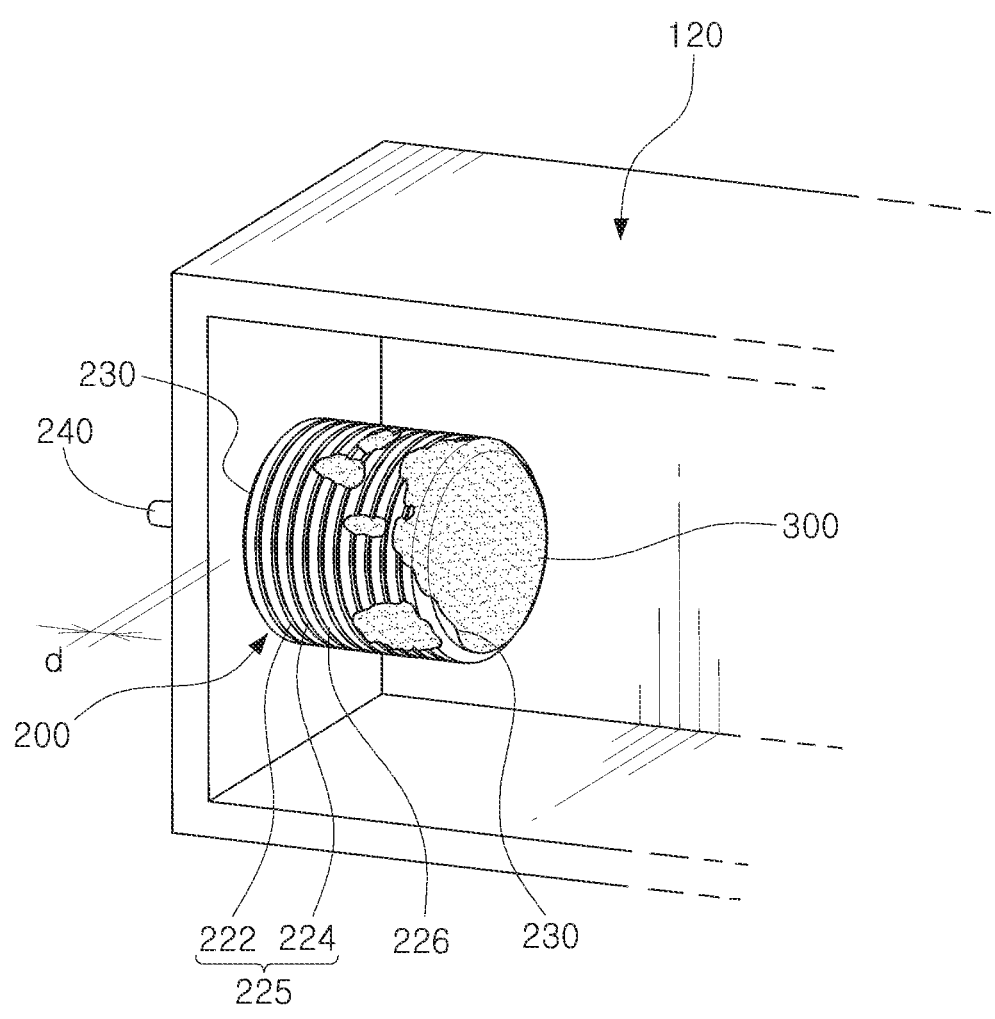
FIG. 7 is a view schematically illustrating flakes generated in a repeller inside an arc chamber.

FIG. 7 is a view schematically illustrating flakes generated in a repeller inside an arc chamber.

FIG. 7 shows the results of performing a $BF_3$ process of injecting boron trifluoride ($BF_3$) into the arc chamber 120 of the ion generating apparatus 10 and then generating B+ ions in the high-vacuum arc chamber 120 at high temperature and high pressure to make the inside of the arc chamber 120 plasma for a long period of time. When the $BF_3$ process is used for a certain period of time or more, flakes 300 may occur in the repeller 200.

When flakes 300 occur, insulation between the arc chamber 120 and the repeller 200 is not maintained and may cause ion beam shakes, so PM should be executed.

The surface area of the repeller 200 is increased by the striped grooves 222 and 224 formed in the longitudinal direction of the repeller 200 in a cylindrical shape, and a surface temperature of the repeller 200 is uniform in a high vacuum state. When the surface temperature of the repeller 200 is uniform, contamination caused by the occurrence of flakes 300 is limited and/or suppressed, thereby reducing irregular PM occurrence and lengthening a regular PM cycle.

In addition, since the occurrence of flakes 300 in the repeller 200 is delayed, shaking of the ion beam due to the occurrence of the flakes 300 may also be delayed, so that the frequency of quality defects of the semiconductor wafer W may be reduced.

According to the repeller, the ion generating apparatus, and the semiconductor wafer ion implantation apparatus of inventive concepts, the life of the repeller may increase by forming the repeller to have a cylindrical shape in the arc chamber to make a temperature distribution of the surface area of the repeller uniform.

In addition, since a temperature change of the repeller is constant, the occurrence of flakes may be suppressed, thereby limiting and/or preventing a short circuit between the repeller and the arc chamber.

In addition, since the temperature change of the repeller is constant, irregular PM may not occur and impurities may be stably doped into the semiconductor wafer, thereby significantly reducing product quality accidents.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been illustrated and described above, it will be apparent to those skilled in the art that modifications and variations could be made without departing from the scope of inventive concepts as defined by the appended claims.

What is claimed is:

1. A repeller for mounting inside an arc chamber of an ion implantation apparatus for doping impurities into a surface film of a semiconductor wafer, the repeller comprising:

a body including an outer circumferential surface; and a surface area enlargement portion on the body, the surface area enlargement portion including striped grooves continuously formed on the outer circumferential surface of the body at intervals in a longitudinal direction of the body.

2. The repeller of claim 1, further comprising:

an insulating rod, wherein the body has a cylindrical shape and includes an inner recess on a lower side thereof in the longitudinal direction, and the insulating rod is inserted in the inner recess and extends away from the inner recess in the longitudinal direction of the body.

3. The repeller of claim 1, wherein the striped grooves are annular grooves, and a number of the striped grooves is greater than or equal to two and less than or equal to ten.

4. The repeller of claim 1, wherein the surface area enlargement portion includes protrusions defining the striped grooves, widths (Wp) of the protrusions are larger than widths (Wg) of the striped grooves.

5. The repeller of claim 4, wherein a ratio Wp/Wg of the widths of the protrusions and the widths of the striped grooves is less than 9/7.

6. The repeller of claim 1, wherein a front end of the body in the longitudinal direction includes a flat surface.

7. An ion generating apparatus comprising:

an arc chamber defining a space for generating plasma, the arc chamber including a first side and a second side;

a cathode, the cathode in the arc chamber and supported on the first side of the arc chamber; and a repeller, the repeller being in the arc chamber and supported on the second side of the arc chamber, the repeller facing the cathode, wherein the repeller includes a surface area enlargement portion on an outer circumferential surface of the repeller, and the surface area enlargement portion includes striped grooves continuously formed at intervals in a longitudinal direction of the repeller.

8. The ion generating apparatus of claim 7, wherein the repeller has a cylindrical shape and includes an inner recess formed on a lower side thereof in the longitudinal direction, the repeller further includes an insulating rod, and the insulating rod is inserted into the inner recess and extends away from the inner recess in the longitudinal direction of the repeller.

9. The ion generating apparatus of claim 8, wherein the insulating rod is inserted into an inner wall of the arc chamber, and the insulating rod positions a lower portion of the repeller a gap away from the inner wall of the arc chamber.

10. The ion generating apparatus of claim 7, wherein the striped grooves are annular grooves, and a number of the striped grooves is greater than or equal to two and less than or equal to ten.

11. The ion generating apparatus of claim 7, wherein the surface area enlargement portion includes protrusions defining the striped grooves, and widths (Wp) of the protrusions are larger than widths (Wg) of the striped grooves.

12. The ion generating apparatus of claim 11, wherein a ratio Wp/Wg of the widths of the protrusions and the widths of the striped grooves is less than 9/7.

13. The ion generating apparatus of claim 7, wherein a front end of the repeller in the longitudinal direction includes a flat surface.

14. The ion generating apparatus of claim 7, wherein the arc chamber is driven at a temperature of 2000° C. or more according to the plasma and a high vacuum condition of about 1.0 e-5 torr.

15. A semiconductor wafer ion implantation apparatus comprising:

an ion generating apparatus including an arc chamber defining a space for generating plasma, a cathode in the arc chamber and supported on a first side of the arc chamber, and a repeller in the arc chamber and supported on a second side of the arc chamber, the repeller facing the cathode; and an implantation chamber for injecting an ion beam emitted through the arc chamber into a semiconductor wafer, wherein the repeller includes a surface area enlargement portion on an outer circumferential surface of the repeller, and the surface area enlargement portion includes striped grooves continuously formed at intervals in a longitudinal direction of the repeller.

16. The semiconductor wafer ion implantation apparatus of claim 15, wherein the repeller has a cylindrical shape and includes an inner recess formed on a lower side thereof in the longitudinal direction, the repeller further includes an insulating rod, the insulating rod is inserted into the inner recess and extends away from inner recess in the longitudinal direction of the repeller.

17. The semiconductor wafer ion implantation apparatus of claim 16, wherein the insulating rod is inserted into an inner wall of the arc chamber, and the insulating rod positions a lower portion of the repeller a gap away from the inner wall of the arc chamber.

18. The semiconductor wafer ion implantation apparatus of claim 15, wherein the striped grooves are annular grooves, and a number of the striped grooves is greater than or equal to two and less than or equal to ten.

19. The semiconductor wafer ion implantation apparatus of claim 15, wherein the surface area enlargement portion includes protrusions defining the striped grooves, and widths (Wp) of the protrusions are larger than widths (Wg) of the striped grooves.

20. The semiconductor wafer ion implantation apparatus of claim 15, wherein a front end of the repeller in the longitudinal direction includes a flat surface.

* * * * *